United States Patent
Sano

(10) Patent No.: US 9,474,159 B2
(45) Date of Patent: Oct. 18, 2016

(54) COMPONENT-EMBEDDED BOARD AND METHOD OF MANUFACTURING SAME

(71) Applicant: FUJIKURA LTD., Koto-ku, Tokyo (JP)

(72) Inventor: Yoshinori Sano, Sakura (JP)

(73) Assignee: FUJIKURA LTD., Tokyo (JP)

( * ) Notice: Subject to any disclaimer, the term of this patent is extended or adjusted under 35 U.S.C. 154(b) by 276 days.

(21) Appl. No.: 14/156,991

(22) Filed: Jan. 16, 2014

(65) Prior Publication Data

US 2014/0133118 A1    May 15, 2014

Related U.S. Application Data

(63) Continuation of application No. PCT/JP2012/071300, filed on Aug. 23, 2012.

(30) Foreign Application Priority Data

Aug. 23, 2011  (JP) .................. 2011-181544

(51) Int. Cl.
　　*H05K 1/18*　　(2006.01)
　　*B29C 65/48*　　(2006.01)
　　(Continued)

(52) U.S. Cl.
　　CPC .............. *H05K 1/186* (2013.01); *B29C 65/48* (2013.01); *H05K 3/4069* (2013.01); *H05K 3/4617* (2013.01); *H05K 2201/096* (2013.01); *Y10T 156/10* (2015.01)

(58) Field of Classification Search
　　CPC .. H05K 1/186; H05K 3/4069; H05K 3/4617; H05K 2201/096
　　USPC .................................................. 361/760–764
　　See application file for complete search history.

(56) References Cited

U.S. PATENT DOCUMENTS

| 7,049,528 B2 * | 5/2006 | Kariya .............. H01L 23/49811 174/250 |
| 2002/0192442 A1 * | 12/2002 | Kondo .................. H05K 1/186 428/209 |

(Continued)

FOREIGN PATENT DOCUMENTS

| JP | 2001-68617 A | 3/2001 |
| JP | 2006-245104 A | 9/2006 |

(Continued)

OTHER PUBLICATIONS

Machine Translation of JP 2009164287, previously filed.

(Continued)

*Primary Examiner* — Courtney Smith
*Assistant Examiner* — Jessey R Ervin
(74) *Attorney, Agent, or Firm* — Sughrue Mion, PLLC

(57) ABSTRACT

Provided is a component-embedded board. The board includes: a first base including first substrate incorporating a first electric component and first electrode provided on a first face of the substrate and electrically connected to the electric component; a second electronic component fixed on the first face with a first adhesion portion therebetween; a second base including second substrate in which the second electronic component is embedded and second electrode exposed at a first face of the second substrate; a second adhesion portion arranged between the first and second bases; a third base including third substrate and third electrode exposed at a first face of the third substrate; and a third adhesion portion arranged between the second and third bases. The first, second and third electrodes are electrically connected to the second electronic component, and the second electronic component is surrounded, at least, by the first and third adhesion portions.

4 Claims, 13 Drawing Sheets

(51) Int. Cl.
*H05K 3/40* (2006.01)
*H05K 3/46* (2006.01)

(56) References Cited

U.S. PATENT DOCUMENTS

2006/0120056 A1* 6/2006 Sasaki ................ H01L 23/3107
361/735
2010/0314352 A1* 12/2010 Chen .................. H01L 21/6835
216/13

FOREIGN PATENT DOCUMENTS

| JP | 2008-270362 A | 11/2008 |
|---|---|---|
| JP | 2009-164287 A | 7/2009 |
| JP | 2009277846 A | 11/2009 |

OTHER PUBLICATIONS

Machine Translation of JP 2006245104, previously filed.
Machine Translation of JP 2001068617, previously filed.
Communication dated Mar. 26, 2015 from the European Patent Office in counterpart Application No. 12825582.5.
Communication dated Jul. 24, 2012 from the Japanese Patent Office in counterpart Application No. 2011-181544.
Communication dated Aug. 26, 2014 from the Japanese Patent Office in counterpart Application No. 2013-530054.
International Search Report for PCT/JP2012/071300 dated Oct. 9, 2012.

* cited by examiner

COMPONENT-EMBEDDED BOARD AND METHOD OF MANUFACTURING SAME

CROSS REFERENCE TO RELATED APPLICATIONS

This application is a continuation application based on a PCT Patent Application No. PCT/JP2012/071300, filed Aug. 23, 2012, whose priority is claimed on Japanese Patent Application No. 2011-181544 filed Aug. 23, 2011, the entire content of which are hereby incorporated by reference.

BACKGROUND OF THE INVENTION

1. Field of the Invention

The present invention relates to a component-embedded board incorporating an electric component and a method of manufacturing the same.

2. Description of the Related Art

Miniaturization and high functionality of electric equipment has been achieved as well as miniaturization of electronic components incorporated in equipment. Even for a printed wiring board for mounting electric components, higher density, multilayer, multi-layering, and enhancement of high-speed transmission characteristics are required. As a technology to meet these requirements, there is a packaging technology called EWLP (Embedded Wafer Level Package). EWLP is a technology for mounting semiconductor components (electric component) such as a WLCSP (Wafer Level Chip Size Package) to a printed wiring board. According to EWLP, it is possible to improve the packaging density, reduce the wiring length between the semiconductor elements, and enhance the high-speed transmission characteristics.

A component-embedded board is known in which an electric component is embedded in a double-sided wiring board and a single-sided wiring board is laminated on both sides thereof (see Japanese Unexamined Patent Application, First Publication No. 2008-270362).

FIG. 18 is an example of a component-embedded board. The component-embedded board 100 includes a double-sided wiring board A103 in which a conductive layer 4 is formed on both faces of an insulation resin layer 3, and single-sided wiring boards A101, A102, A104, and A105 in which the conductive layer 4 are formed on the outer side of the insulation resin layer 3. One and the other faces of the double-sided wiring board A103 are provided with the single-sided wiring boards A101, A102, A104, and A105. An electric component 2 is embedded in an opening portion 103a of the double-sided wiring board A103.

The wiring boards A101-A105 are adhered together with an adhesion layer 5 and electrically connected to each other through an interlayer conductive portion 1.

FIG. 19 and FIG. 20 are a process drawing showing an example of a method of manufacturing a component-embedded board 100. The manufacturing method includes: disposing single-sided wiring boards A102 and A104 which are provided with the adhesion layer 5 on one face and the other face of the double-sided wiring board A103, respectively, such that the adhesion layer 5 opposes the double-sided wiring board A103; and collectively laminating them.

In the component-embedded board 100, both faces of the electric component 2 need to be covered by adhesive material (adhesion layer 5) in view of improving the durability. For this reason, the single-sided wiring boards A102 and A104 are disposed such that their adhesion layers 5 face the inner-layer side (toward wiring board A103).

When another single-sided wiring board is added at the outer-layer side of the single-sided wiring boards A102 and A104, the additional single-sided wiring board is also disposed such that its adhesion layer faces the inner-layer side. In this structure, when an electric component needs to be embedded in the additional single-sided wiring board as well, another adhesion layer needs to be provided on a face of the electric component so as to face the inner-layer side.

However, when such an additional adhesion layer is formed, the total thickness of the adhesion layer will increase, which causes a problem in that the whole thickness of the component-embedded board will increase.

The present invention was made in view of the above-described circumstances and the object thereof is providing a component-embedded board and a method of manufacturing the same which enable a reduction of the whole thickness of the component-embedded board incorporating an electric component to be achieved.

SUMMARY OF THE INVENTION

A component-embedded board according to an aspect of the present invention includes: a first base including a first substrate which incorporates a first electric component, and a first electrode which is provided on a first face of the first substrate and electrically connected to the first electric component; a first adhesion portion provided on the first face of the first substrate; a second electronic component fixed on the first face of the first substrate with the first adhesion portion therebetween; a second base including a second substrate having an opening portion in a position at which the second electronic component is embedded, and a second electrode exposed at a first face of the second substrate; a second adhesion portion arranged between the first base and the second base, and fixing a second face of the second substrate on the first face of the first substrate; a third base including a third substrate and a third electrode which is exposed at a first face of the third substrate; and a third adhesion portion arranged between the second base and the third base, and fixing a second face of the third substrate on the first face of the second substrate, wherein the first electrode, the second electrode, and the third electrode are electrically connected to the second electronic component, and the second electronic component is surrounded, at least, by the first adhesion portion and the third adhesion portion.

It may be arranged such that the first base includes an inner-layer base which incorporates the first electric component, a first-side base which faces a first face of the inner-layer base, and a second-side base which faces a second face of the inner-layer base, the inner-layer base includes an inner-layer substrate which has an opening portion in a position at which the first electric component is embedded, and inner-layer electrodes formed on both faces of the inner-layer substrate, the first-side base includes a first-side substrate and a first-side electrode formed on a face of the first-side substrate which is opposite to the inner-layer substrate, the second-side base includes a second-side substrate and a second-side electrode formed on a face of the second-side substrate which is opposite to the inner-layer substrate, and the first-side electrode and the second-side electrode are electrically connected to the inner-layer electrode.

It may be arranged such that the second electronic component is surrounded by the first adhesion portion, the second adhesion portion, and the third adhesion portion.

A method of manufacturing the above-described component-embedded board according to an aspect of the present invention includes: arranging the first adhesion portion on the second face of the second substrate; and fixing the second electronic component to the first adhesion portion.

A method of manufacturing a component-embedded board according to an aspect of the present invention includes: arranging the first adhesion portion on the first face of the first substrate; and fixing the second electronic component to the first adhesion portion.

Based on the above-described aspects of the present invention, since the second electronic component embedded in the opening portion of the second base is fixed to the first base via the first adhesion portion, both faces of the second electronic component are covered by the first adhesion portion and the third adhesion portion, respectively.

The first adhesion portion and the second adhesion portion are present in the same plane (on the first substrate) when being laminated. For this reason, the total thickness of the adhesion portions covering both faces of the second electronic component can be substantially the same as that of the adhesion portions for laminating the first to third bases.

Accordingly, the thickness of the adhesion portions can be minimized, and thus a reduction of the whole thickness of the component-embedded board can be achieved.

DETAILED DESCRIPTION OF THE PREFERRED EMBODIMENTS

Embodiments of the present invention will be described with reference to the drawings.

Figure 17:
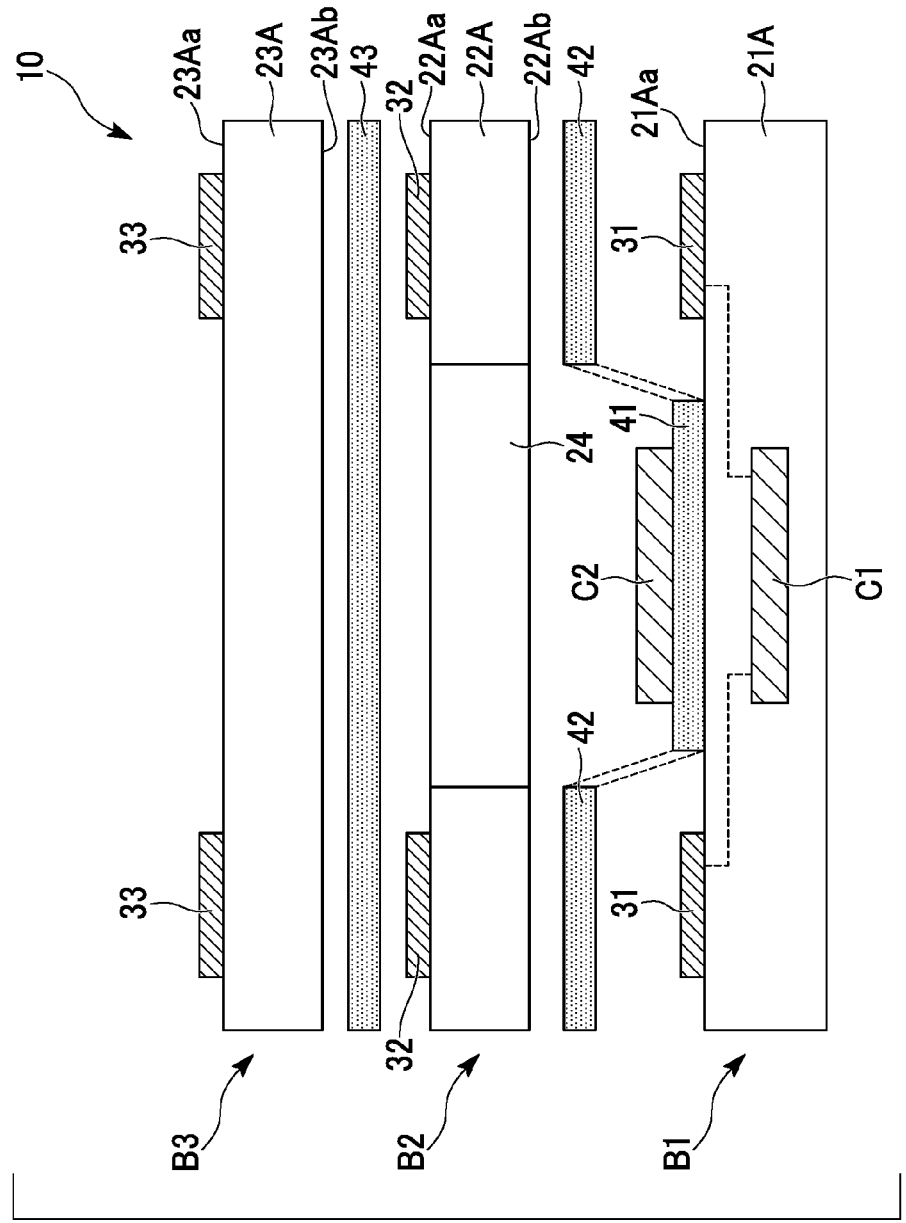
FIG. 17 is a cross-sectional view schematically showing the structure of a component-embedded board according to the first embodiment of the present invention.
Figure 18:
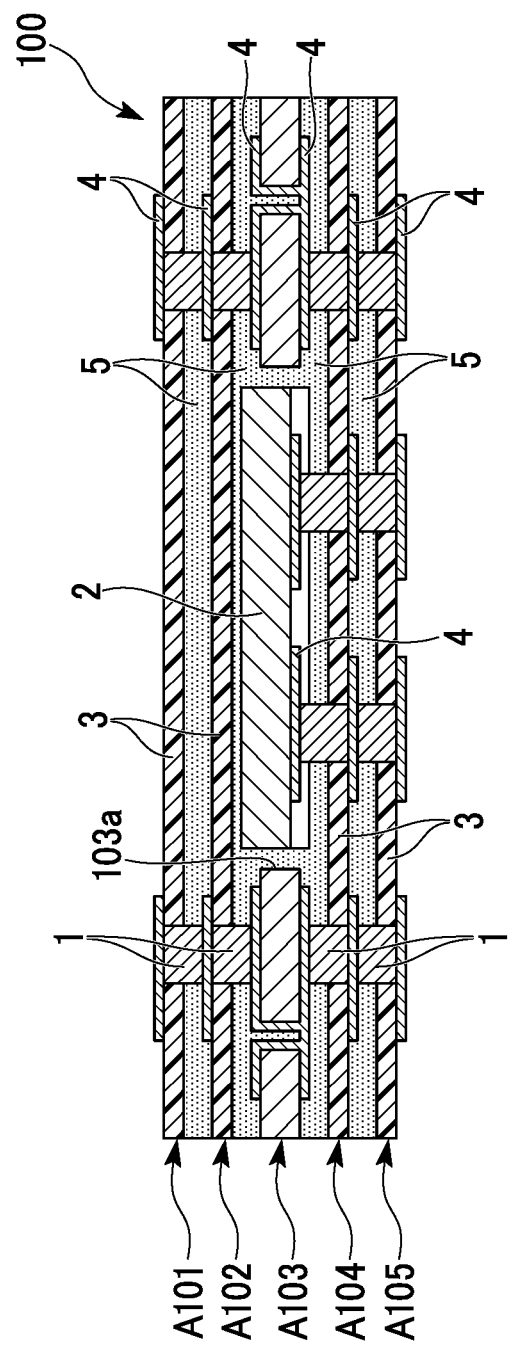
FIG. 18 is a cross-sectional view showing an example of a conventional component-embedded board.
Figure 19:
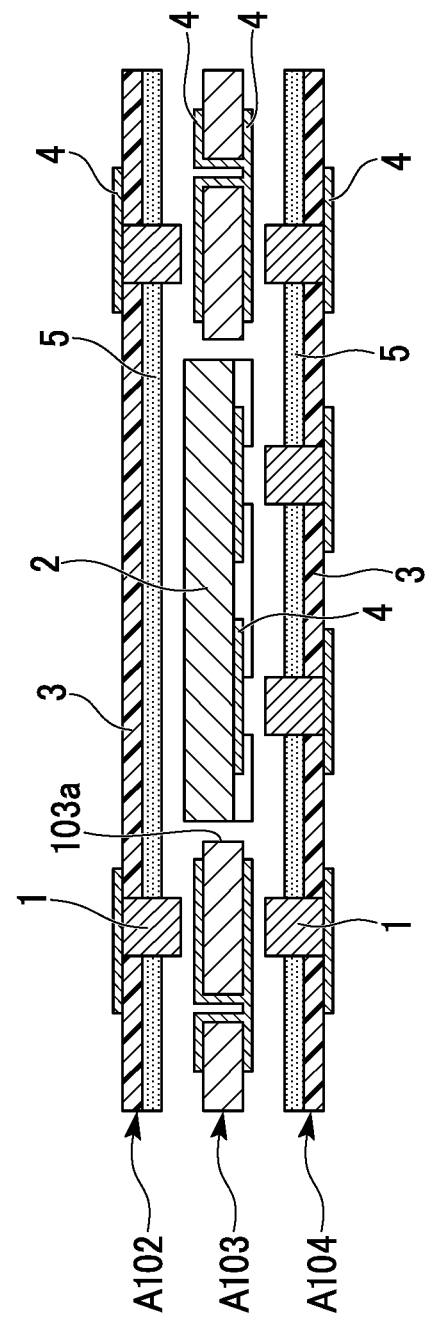
FIG. 19 is a process drawing showing an example of a method of manufacturing a conventional component-embedded board.
Figure 20:
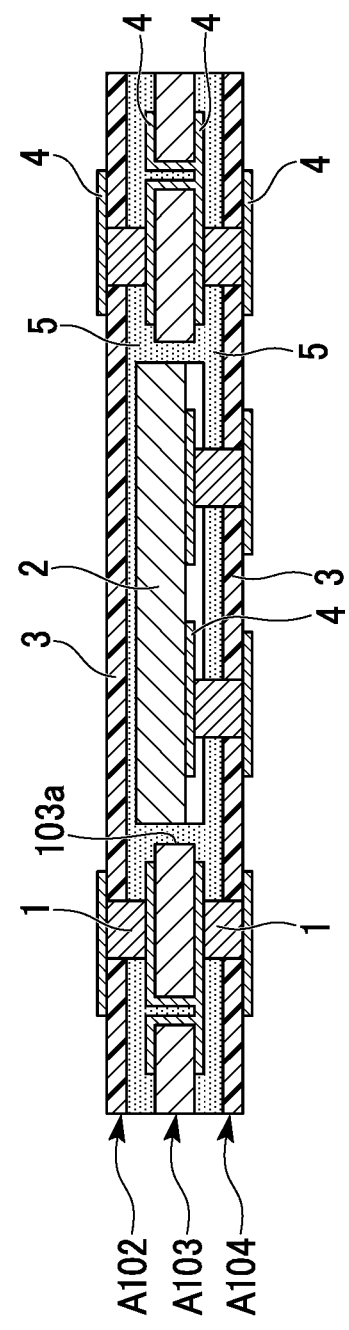
FIG. 20 is a process drawing following the previous figure.

FIG. 17 is a cross-sectional view schematically showing the structure of a component-embedded board 10 according to a first embodiment of the present invention.

The component-embedded board 10 includes, at least, a first base B1 including a first substrate 21A, a second electronic component C2 fixed on a face 21Aa of the first substrate 21A via a first adhesion portion 41, a second base B2 being fixed on the face 21Aa of the first substrate 21A via a second adhesion portion 42, and a third base B3 being fixed on a second substrate 22A of the second base B2 via a third adhesion portion 43.

The first to third substrates 21A-23A may be an insulation resin layer made of, for example, polyimide or the like.

The first and second electronic components C1 and C2 are, for example, a resistor, capacitor, IC, diode, transistor, semiconductor (bear) chip, or WLCSP.

The first substrate 21A of the first base B1 incorporates the first electric component C1. A first electrode 31 is formed on the first face 21Aa of the first substrate 21A. The first electrode 31 is exposed at the first face 21Aa of the first substrate 21A and electrically connected to the first electric component C1.

The second base B2 includes the second substrate 22A, and the second substrate 22A has an opening portion 24 at which the second electronic component C2 is embedded. A second electrode 32 is formed on a first face 22Aa of the second substrate 22A so as to be exposed. A second face 22Ab of the second substrate 22A is fixed on the first face 21Aa of the first substrate 21A via the second adhesion portion 42.

The third base B3 includes a third substrate 23A. A third electrode 33 is formed on a first face 23Aa of the third substrate 23A so as to be exposed. A second face 23Ab of the third substrate 23A is fixed on the first face 22Aa of the second substrate 22A via the third adhesion portion 43.

The first electrode 31, the second electrode 32, and the third electrode 33 include a unit for making an electrical connection with the second electronic component C2. For example, the first electrode 31, the second electrode 32, and the third electrode 33 may be electrically connected to the second electronic component C2 through an interlayer conductive portion (not shown in the figures) formed so as to penetrate the substrates 22A and 23A in the thickness direction, a conductive layer (not shown in the figures) formed on the faces 21Aa, 22Aa, 22Ab, 23Aa, and 23Ab, or the like.

The second electronic component C2 is surrounded by the first adhesion portion 41, the second adhesion portion 42, and the third adhesion portion 43.

In the component-embedded board 10, since the second electronic component C2 embedded in the opening portion 24 of the second base B2 is fixed to the first base B1 via the first adhesion portion 41, both faces of the second electronic component C2 are covered by the first adhesion portion 41 and the third adhesion portion 43 of the third base B3.

The first adhesion portion 41 is on the first substrate 21A as with the second adhesion portion 42. That is, the first adhesion portion 41 and the second adhesion portion 42 are formed in the same plane when being laminated.

Accordingly, the total thickness of the adhesion portions 41 and 43 covering both faces of the second electronic component C2 can be substantially the same as the total thickness of the adhesion portions 42 and 43 for laminating the first base B1 to the third base B3, the thickness of the adhesion portions can be minimized, and thus a reduction of the whole thickness of the component-embedded board 10 can be achieved.

Next, embodiments of the present invention will be explained referring further specific examples. In the description below, unless otherwise specified, a first face refers to an upper-side face and a second face refers to a lower-side face in FIG. 1.

Figure 1:
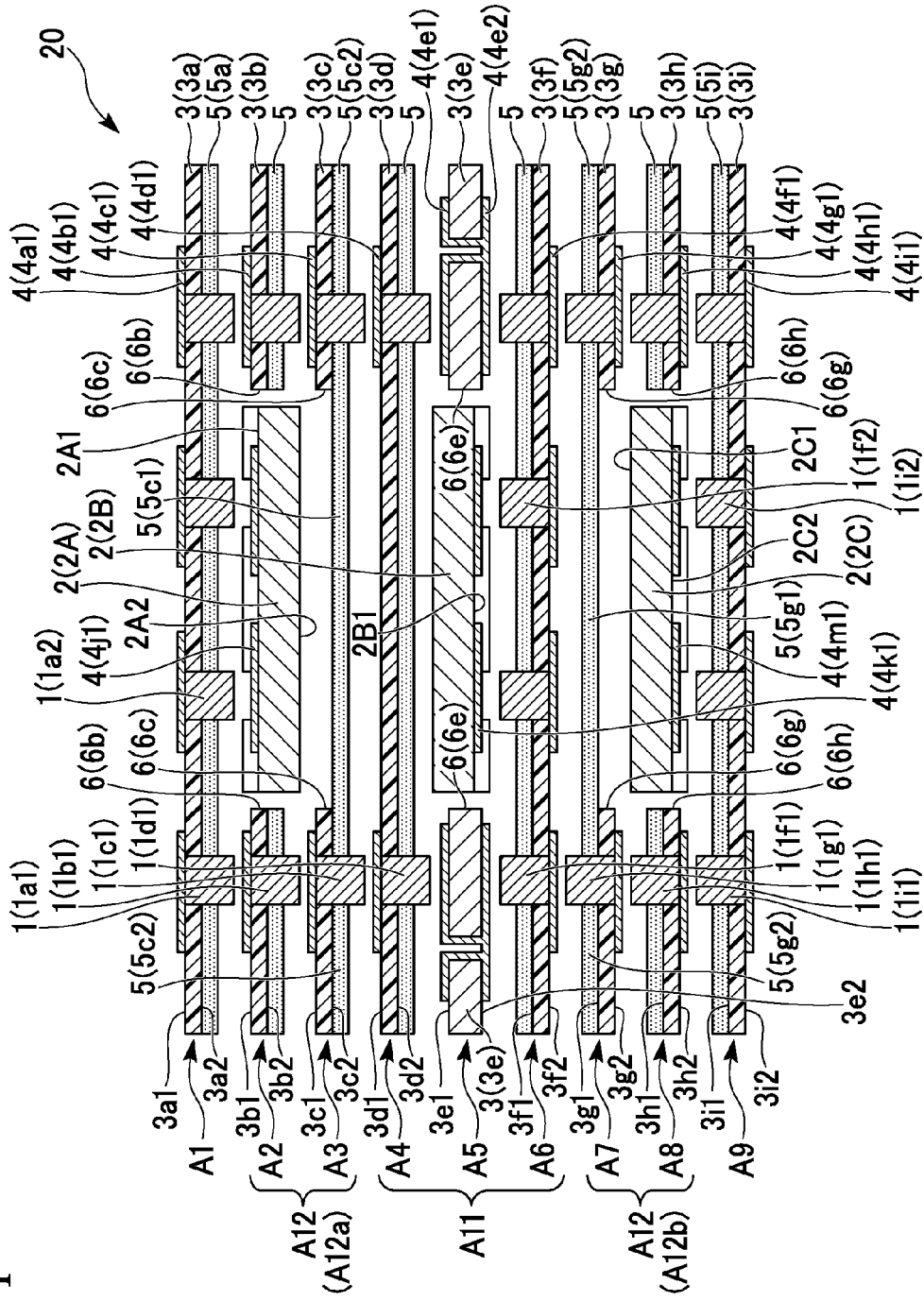
FIG. 1 is a cross-sectional view showing a component-embedded board according to the second embodiment of the present invention before lamination.
Figure 2:
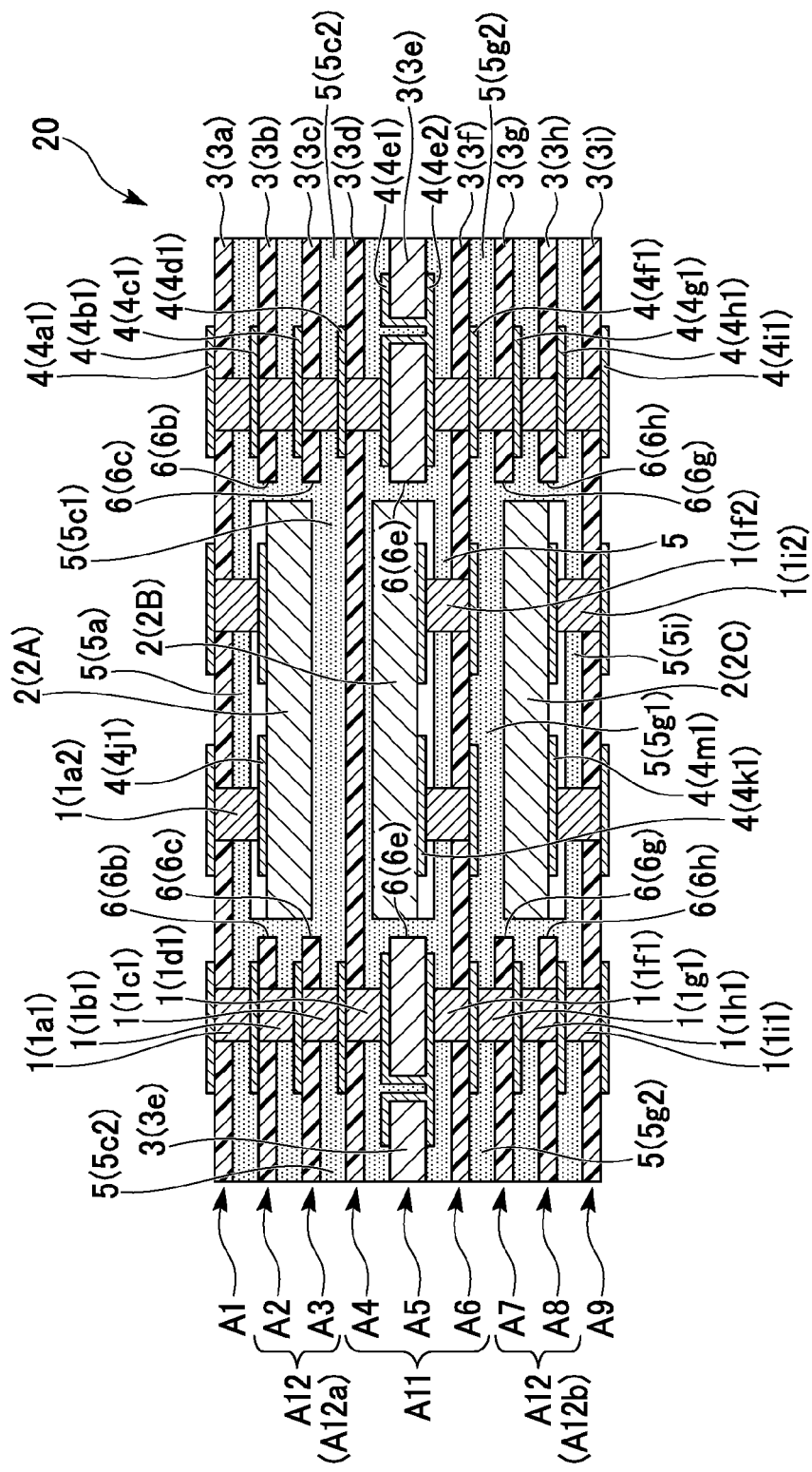
FIG. 2 is a cross-sectional view showing a component-embedded board obtained by laminating the substrates shown in FIG. 1.

FIG. 1 is a cross-sectional view showing a component-embedded board 20 according to a second embodiment of the present invention before lamination. FIG. 2 is a cross-sectional view showing the component-embedded board 20 after a lamination.

As shown in FIG. 1 and FIG. 2, the component-embedded board 20 is, for example, a laminated printed wiring board with a built-in electric component 2, which includes: a first component substrate A11 (first base) incorporating a first electric component 2 (2B); second and third electric component 2 (2A and 2C) provided on and under (both sides of) the first component substrate A11; an intermediate substrate A12 (A12a and A12b) (second base) provided on and under (both sides of) the first component substrate A11; and first and ninth wiring boards A1 and A9 (third base) provided further outside the intermediate substrate A12 (A12a and A12b), respectively.

Wiring boards A2-A8 constituting the substrates A11 and A12, and a wiring board body 3 (3a-3i) of the wiring boards A1 and A9 are an insulation resin layer (insulator) made of, for example, polyimide or the like. A conductive layer 4 (4a1-4i1) (electrode) of the wiring boards A1-A9 and the electric component 2 (2A-2C) are made of conductive material such as copper. The conductive layer 4 may be a wiring layer formed in the wiring boards A1-A9 and the electric components 2A-2C.

An interlayer conductive portion 1 (1a1-1i1) is formed so as to penetrate, the wiring board body 3 of the wiring boards A1-A9 in the thickness direction. The interlayer conductive portion 1 is obtained preferably by heating and curing conductive paste containing metal particles such as nickel, silver, copper, tin, bismuth, indium, and lead. Alternatively, conductive paste containing low electric-resistive metal particles such as nickel, silver, and copper as well as low melting point metal particles such as tin, bismuth, indium, and lead.

A wide variety of know adhesives in the manufacturing domain of printed wiring boards may be employed for the adhesion layer 5 (5a-5i) (adhesion portion). Preferable examples thereof includes polyimide-based adhesive and epoxy-based adhesive.

The shape and size of an opening portion 6 (6b-6h) of the wiring board body 3 may be determined in accordance with the electric component 2 and the opening portion 6 (6b-6h) may be formed in a position at which the electric component 2 is to be embedded.

A single-sided copper-clad laminate (CCL) including the wiring board body 3 and a conductive layer provided on the first face of the wiring board body 3 may be employed for the wiring boards A1-A4 and A6-A9. A double-sided copper-clad laminate (CCL) including the wiring board body 3 and the conductive layer 4 provided on both faces of the wiring board body 3 may be employed for the fifth wiring board A5.

The first component substrate A11 includes the fifth wiring board A5 (inner-layer base) incorporating the first electric component 2B, the fourth wiring board A4 (first-side base) facing the first face (upper face in FIG. 1) of the fifth wiring board A5, and the sixth wiring board A6 (the second-side base) facing the second face (lower face in FIG. 1) of the fifth wiring board A5.

The fifth wiring board A5 includes the fifth wiring board body 3e (inner-layer substrate) having the opening portion 6e in a position at which the first electric component 2B is to be embedded. The inner-layer conductive layer 4e1 (electrode) is formed on a first face 3e1 of the fifth wiring board body 3e. The inner-layer conductive layer 4e2 (electrode) is formed on a second face 3e2 of the fifth wiring board body 3e. The inner-layer conductive layers 4e1 and 4e2 are connected to each other and electrically connected to the first electric component 2B.

The fourth wiring board A4 includes the fourth wiring board body 3d (first-side substrate). The first-side conductive layer 4d1 (electrode) is formed on a first face 3d1 (upper face) of the fourth wiring board body 3d, and the adhesion layer 5 is formed on a second face 3d2 (lower face).

The first-side conductive layer 4d1 is electrically connected to the inner-layer conductive layer 4e1 through the interlayer conductive portion 1d1 which penetrates the fourth wiring board body 3d.

The sixth wiring board A6 includes the sixth wiring board body 3f (second-side substrate), the second-side conductive layer 4f1 (electrode) is formed on a second face 3f2 (lower face) of the sixth wiring board body 3f, and the adhesion layer 5 is formed on a first face 3f1 (upper face).

Some of the second-side conductive layers 4f1 are electrically connected to the inner-layer conductive layers 4e2 through the interlayer conductive portions 1f1 which penetrate the sixth wiring board body 3f. The other of the second-side conductive layers 4f1 are connected to the conductive layers 4k1 (electrode) of the first electric component 2B through the interlayer conductive portions 1f2.

The first-third electric components 2 (2A-2C) may be a passive component such as resistor and capacitor, or may be an active component such as IC, diode, transistor. In addition, it may be a semiconductor (bare) chip having a semiconductor element or a WLCSP.

The conductive layer 4k1 is formed on a second face 2B1 (lower face) of the first electric component 2B. The first electric component 2B is arranged inside the opening portion 6e of the fifth wiring board A5.

The intermediate substrate A12 (A12a) includes the second wiring board A2 and the third wiring board A3 facing a second face (lower face) of the second wiring board A2.

The second wiring board A2 includes the second wiring board body 3b having the opening portion 6b in a position at which the second electric component 2A is to be embedded. The second conductive layer 4b1 (electrode) is formed on the first face 3b1 (upper face side) of the second wiring board body 3b, while the adhesion layer 5 is formed on a second face 3b2 (lower face side).

The second conductive layer 4b1 is electrically connected to the third conductive layer 4c1 through the interlayer conductive portion 1b1 which penetrates the second wiring board body 3b. In addition, the second conductive layer 4b1 is electrically connected to the second electric component 2A.

The third wiring board A3 includes the third wiring board body 3c having an opening portion 6c in a position at which the second electric component 2A is to be embedded. The third conductive layer 4c1 (electrode) is provided on a first face 3c1 (upper face) of the third wiring board body 3c.

The third conductive layer 4c1 is electrically connected to the fourth conductive layer 4d1 through the interlayer conductive portion 1e1 which penetrates the third wiring board body 3c.

The substrate adhesion layer 5 (5c2) (second adhesion portion) is formed on part of a second face 3c2 (lower face side) at which the opening portion 6c of the third wiring board body 3c is not formed. The electric component adhesion layer 5 (5c1) (first adhesion portion) is formed on part of the second face (lower face) at which the opening portion 6c is present.

The substrate adhesion layer 5c2 and the electric component adhesion layer 5c1 are integrally formed with each other and form a flat plate shape having a uniform thickness as a whole.

The conductive layer 4j1 is formed on a first face 2A1 (upper face) of the second electric component 2A. The second electric component 2A is arranged inside the opening portions 6b and 6c of the second wiring board A2 and the third wiring board A3.

The first wiring board A1 includes the first wiring board body 3a. The first conductive layer 4a1 (electrode) is formed on a first face 3a1 (upper face) of the first wiring board body 3a, while the adhesion layer 5 (5a) (third adhesion portion) is formed on a second face 3a2 (lower face).

Some of the first conductive layers 4a1 are electrically connected to the second conductive layers 4b1 through the interlayer conductive portions 1a1 which penetrate the first wiring board body 3a. The other of the first conductive layers 4a1 are electrically connected to the conductive layers 4j1 (electrode) of the second electric component 2A through the interlayer conductive portions 1a2.

The intermediate substrate A12 (A12b) includes the seventh wiring board A7 and the eighth wiring board A8 facing the second face (lower face) of the seventh wiring board A7.

The seventh wiring board A7 includes the seventh wiring board body 3g having an opening portion 6g in a position at which the third electric component 2C is to be embedded. A seventh conductive layer 4g1 (electrode) is formed on a second face 3g2 (lower face side) of the seventh wiring board body 3g.

The seventh conductive layer 4g1 is electrically connected to the sixth conductive layer 4f1 through the interlayer conductive portion 1g1 which penetrates the seventh wiring board body 3g.

The substrate adhesion layer 5 (5g2) (second adhesion portion) is formed on part of a first face 3g1 (upper face side) at which the opening portion 6g of the seventh wiring board body 3g is not formed. The electric component adhesion layer 5 (5g1) (first adhesion portion) is formed on the first face (upper face) at which the opening portion 6g is present.

The substrate adhesion layer 5g2 and the electric component adhesion layer 5g1 are integrally formed with each other and form a flat plate shape having a uniform thickness as a whole.

The eighth wiring board A8 includes the eighth wiring board body 3h having opening portion 6h in a position at which the third electric component 2C is to be embedded.

The eighth conductive layer 4h1 (electrode) is formed on a second face 3h2 (lower face) of the eighth wiring board body 3h, while the adhesion layer 5 is formed on a first face 3h1 (upper face).

The eighth conductive layer 4h1 is electrically connected to the seventh conductive layer 4g1 through the interlayer conductive portion 1h1 which penetrates the eighth wiring board body 3h. In addition, the eighth conductive layer 4h1 is electrically connected to the third electric component 2C.

The conductive layer 4m1 is formed on a second face 2C2 (lower face) of the third electric component 2C. The third electric component 2C is arranged within the opening portions 6g and 6h of the seventh wiring board A7 and the eighth wiring board A8.

The ninth wiring board A9 includes the ninth wiring board body 3i. The ninth conductive layer 4i1 (electrode) is formed on a second face 3i2 (lower face) of the ninth wiring board body 3i, while the adhesion layer 5 (5i) (third adhesion portion) is formed on a first face 3i1 (upper face).

Some of the ninth conductive layers 4i1 are electrically connected to the eighth conductive layers 4h1 through the interlayer conductive portions 1i1 which penetrate the ninth wiring board body 3i. The other of the eighth conductive layers 4h1 are connected to the conductive layers 4m1 (electrode) of the third electric component 2C through the interlayer conductive portions 1i2 which penetrate the ninth wiring board body 3i.

Next, an example of a method of manufacturing the component-embedded board 20 will be explained with reference to FIG. 4-FIG. 8.

Figure 4:
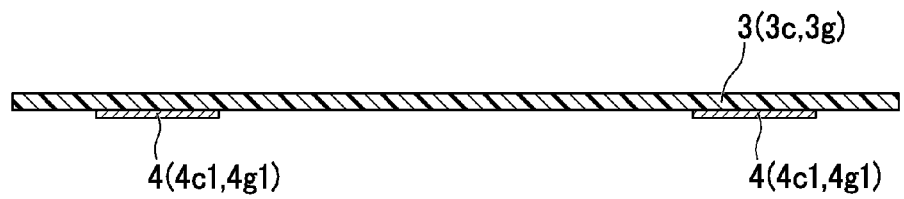
FIG. 4 is a process drawing showing an example of a method of manufacturing a component-embedded board shown in FIG. 2.
Figure 5:
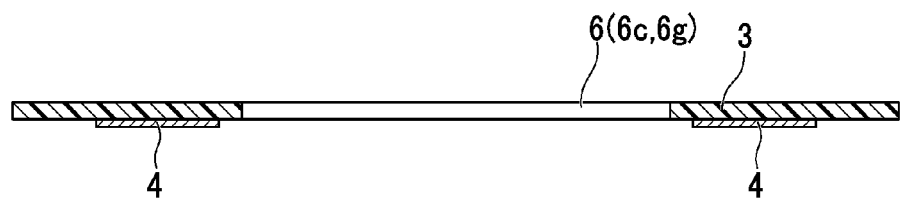
FIG. 5 is a process drawing following the previous figure.

As shown in FIG. 4, the wiring board body 3 (3c and 3g) in which the conductive layer 4 (4c1 and 4g1) is formed on the first face is prepared and the opening portion 6 (6c and 6g) is formed in the wiring board body 3 by laser processing as shown in FIG. 5.

Figure 6:
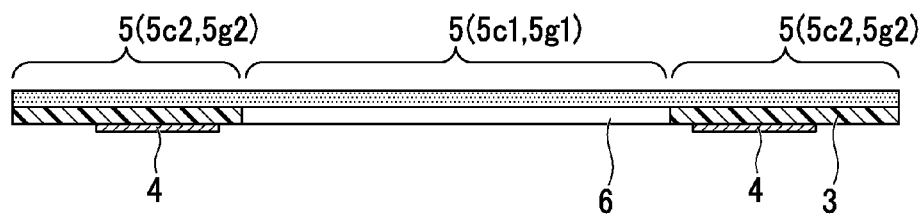
FIG. 6 is a process drawing following the previous figure.
Figure 7:
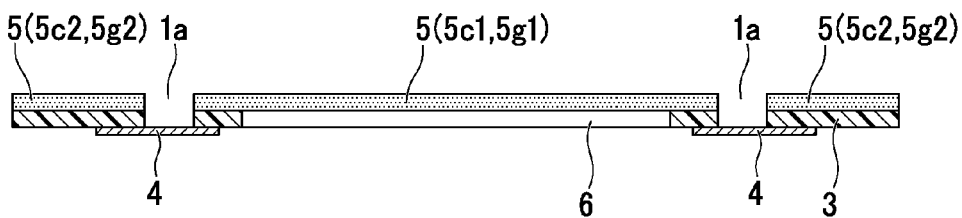
FIG. 7 is a process drawing following the previous figure.

Then, as shown in FIG. 6, an adhesive sheet is laminated on the upper face of the wiring board body 3 (the face facing the conductive layer 4 side) to form the adhesion layer 5. Part of the adhesion layer 5 at which the opening portion 6 is absent is the substrate adhesion layer 5 (5c2 and 5g2), while part of the adhesion layer 5 at which the opening portion 6 is present is the electric component adhesion layer 5 (5c1 and 5g1).

After that, a via 1a is formed in the wiring board body 3 and the adhesion layer 5 by delivering laser beam and performing laser processing and the like.

Figure 8:
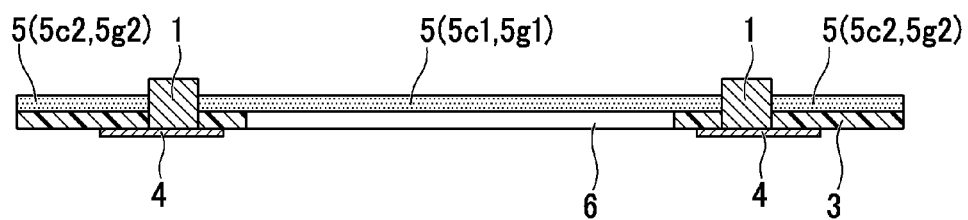
FIG. 8 is a process drawing following the previous figure.

As shown in FIG. 8, the via 1a is filled with conductive paste by screen printing or the like to form the interlayer conductive portion 1, and thereby the wiring board is obtained.

The first-ninth wiring boards A1-A9 and the electric components 2A-2C shown in FIG. 1 and FIG. 2 are laminated by a collective lamination method while using the wiring board shown in FIG. 8 for the third wiring board A3 and the seventh wiring board A7, and thereby the component-embedded board 20 is obtained.

The second electric component 2A is embedded in the component-embedded board 20 so as to be covered by the adhesion layer 5a of the first wiring board A1 and the adhesion layers 5c1 and 5c2 of the third wiring board A3.

The third electric component 2C is embedded in the component-embedded board 20 so as to be covered by the adhesion layer 5i of the ninth wiring board A1 and the adhesion layers 5g1 and 5g2 of the seventh wiring board A7.

As shown in FIG. 1 and FIG. 2, in the component-embedded board 20, the opening portion 6c capable of housing the second electric component 2A is formed in the third wiring board body 3c of the third wiring board A3. For this reason, the electric component adhesion layer 5c1 of the adhesion layer 5 formed on the second face 3c2 (lower face in FIG. 1) of the third wiring board body 3c can abut a second face 2A2 of the second electric component 2A.

As a result, the first face 2A1 of the second electric component 2A is covered by the adhesion layer 5a of the first wiring board A1, while the second face 2A2 is covered by the electric component adhesion layer 5c1 of the third wiring board A3.

The electric component adhesion layer 5c1 is on the second face 3c2 (lower face) of the third wiring board body 3c as with the substrate adhesion layer 5c2. That is, the electric component adhesion layer 5c1 and the substrate adhesion layer 5c2 are arranged in the same plane.

Similarly, the opening portion 6g capable of housing the third electric component 2C is formed in the seventh wiring board body 3g of the seventh wiring board A7. For this reason, the electric component adhesion layer 5g1 of the adhesion layer 5 formed on the first face 3g1 (upper face in FIG. 1) of the seventh wiring board body 3g can abut a first face 2C1 of the third electric component 2C.

As a result, the first face 2C1 of the third electric component 2C is covered by the electric component adhesion layer 5g1 of the seventh wiring board A7, while the second face 2C2 is covered by the adhesion layer 5i of the ninth wiring board A9.

The electric component adhesion layer 5g1 is on the first face 3g1 (upper face) of the seventh wiring board body 3g as with the substrate adhesion layer 5g2. That is, the electric component adhesion layer 5g1 and the substrate adhesion layer 5g2 are arranged in the same plane.

Therefore, the total thickness of the adhesion layer 5 (5a, 5c1, 5g1, and 5i) covering the electric components 2A and 2C can be substantially the same as the total thickness of the adhesion layer 5 (5a, 5c2, 5g2, and 5i) for laminating the wiring boards A1, A3, A7, and A9. As a result, the thickness of the adhesion layer 5 can be minimized, and thus a reduction of the thickness of the component-embedded board 20 can be achieved.

Figure 3:
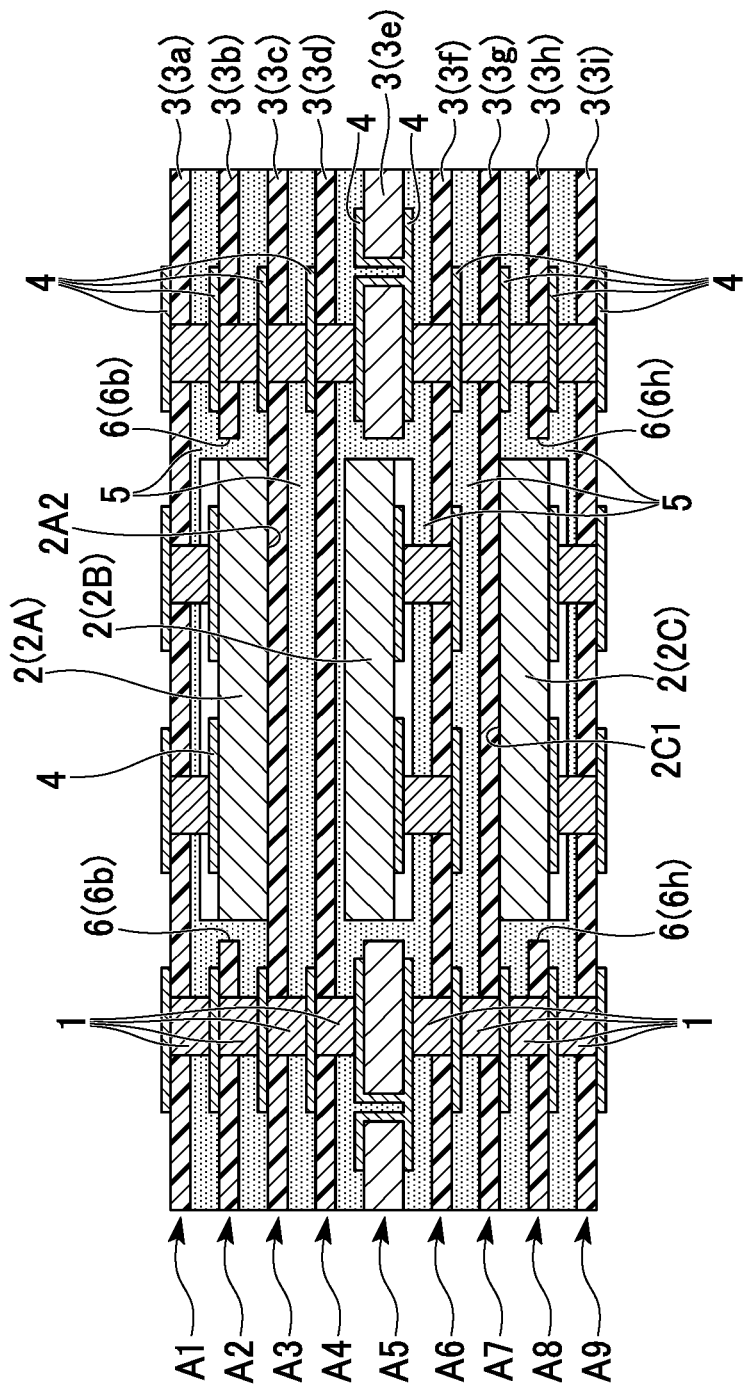
FIG. 3 is a cross-sectional view showing a component-embedded board in which an opening portion is not formed in a third wiring board and a seventh wiring board.

In contrast, as shown in FIG. 3, in the component-embedded board in which the opening portion is not formed in the third wiring board A3 or the seventh wiring board A7, the wiring board body 3 (3c and 3g) of the wiring boards A3 and A7 is present on the faces 2A2 and 2C1 of the electric components 2A and 2C, which encourages peeling between the electric components 2A and 2C and the wiring board body 3. If another adhesion layer is additionally formed between the wiring board body 3 and the electric component 2 in order to avoid it, the whole thickness will increase.

On the other hand, the above-described manufacturing method (refer to FIG. 4-FIG. 8) uses the intermediate substrate A12 (A12a) in which the electric component adhesion layer 5c1 is formed on the second face 3c2 of the third wiring board body 3c of the third wiring board A3, and includes a step of adhering and fixing the second electric component 2A to the electric component adhesion layer 5c1. That is, the method includes a step of arranging the electric component adhesion layer 5c1 in the second face 3c2 of the third wiring board body 3c and a step of fixing the second electric component 2A to the electric component adhesion layer 5c1. For this reason, the adhesion layer 5 of the third wiring board A3 as is can serve as an adhesion layer covering the face 2A1 of the electric component 2A.

Accordingly, without additionally forming another adhesion layer, it is possible to simplify the manufacturing process and enhance the manufacturing efficiency.

Next, an example of a component-embedded board 30 and method of manufacturing the same according to a third embodiment of the present invention will be explained with reference to FIG. 9-FIG. 15. In the following descriptions, the same reference numerals are given to the already-described components and descriptions of those may be omitted.

Figure 9:
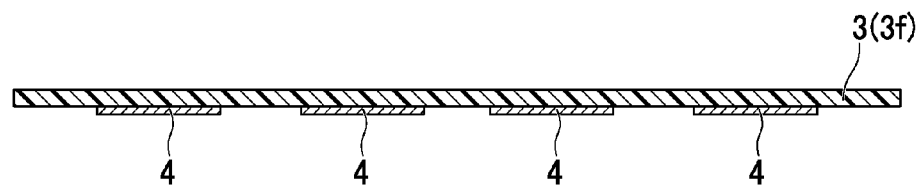
FIG. 9 is a process drawing showing an example of a method of manufacturing a component-embedded board according to the third embodiment of the present invention.
Figure 10:
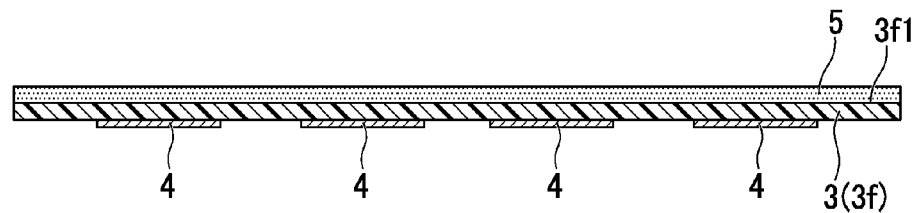
FIG. 10 is a process drawing following the previous figure.

As shown in FIG. 9, the wiring board body 3 (3f) in which the conductive layer 4 is formed on the first face is prepared, the adhesion layer 5 is formed on the upper face (the face facing the conductive layer 4 side) (first face 3f1) of the wiring board body 3 as shown in FIG. 10.

Figure 11:
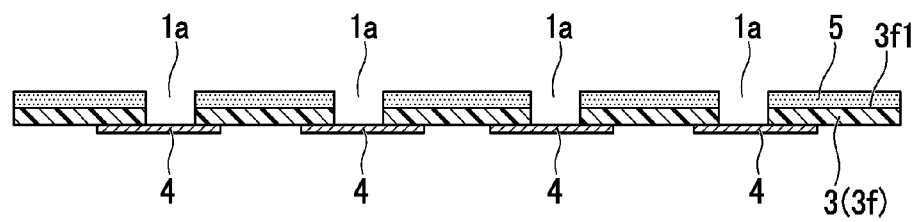
FIG. 11 is a process drawing following the previous figure.

Then, as shown in FIG. 11, the via 1a is formed in the wiring board body 3 and the adhesion layer 5 by laser processing and the like.

Figure 12:
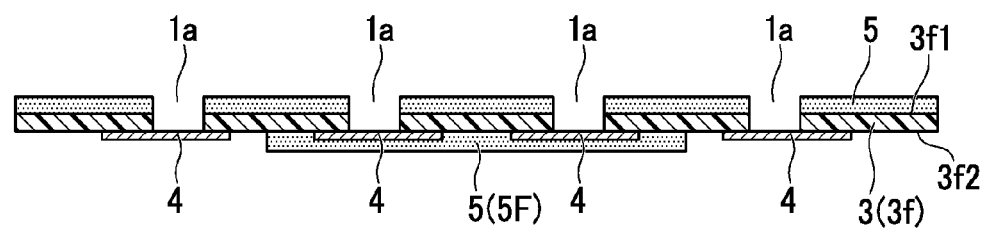
FIG. 12 is a process drawing following the previous figure.

After that, as shown in FIG. 12, the electric component adhesion layer 5 (5F) is formed on the lower face (the face facing the conductive layer 4) (second face 3f2) of the wiring board body 3. The shape, size, position, and the like of the electric component adhesion layer 5F is determined so as to cover the first face 2C1 of the third electric component 2C (refer to FIG. 1 and FIG. 2), and not to overlap the adhesion layer 5g of the seventh wiring board A7.

Figure 13:
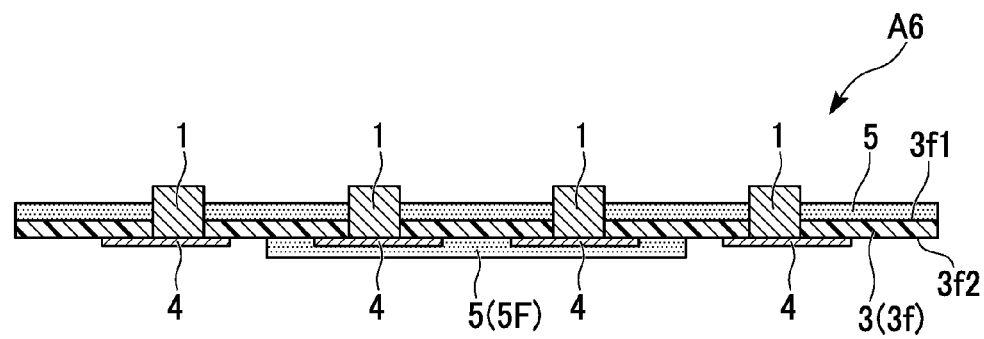
FIG. 13 is a process drawing following the previous figure.

As shown in FIG. 13, the interlayer conductive portion 1 is formed on the via 1a, and thereby the sixth wiring board A6 including the electric component adhesion layer 5F is obtained.

Figure 14:
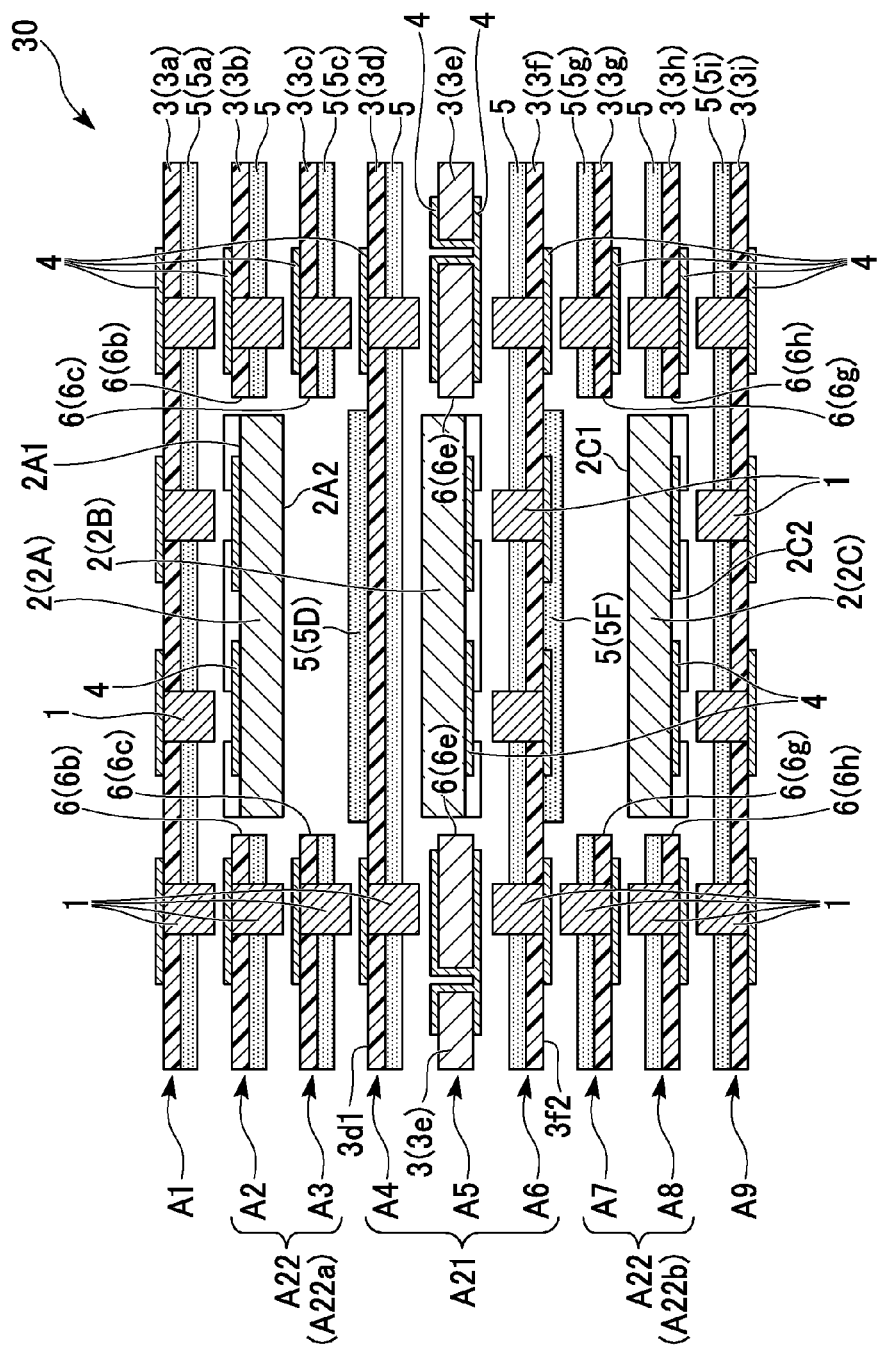
FIG. 14 is a process drawing following the previous figure.

As shown in FIG. 14, in the fourth wiring board A4, the electric component adhesion layer 5D is formed on the first face 3d1 of the fourth wiring board body 3d. The electric component adhesion layer 5D is formed so as to cover the second face 2A2 of the second electric component 2A and not to overlap the adhesion layer 5c of the third wiring board A3.

In contrast to the wiring boards A3 and A7 of the component-embedded board 20 shown in FIG. 1, the third wiring board A3 and the seventh wiring board A7 are not provided with an electric component adhesion layer (5c1 and 5g1 in FIG. 1).

When manufacturing the wiring boards A3 and A7 without an electric component adhesion layer, the adhesion layer 5 may be formed on the wiring board body 3 in advance of forming the opening portion 6 in the wiring board body 3, and then another opening portion may be formed in a region of the adhesion layer 5 opposing the opening portion 6 in the process of forming the opening portion 6 in the wiring board body 3 by laser processing and the like.

Figure 15:
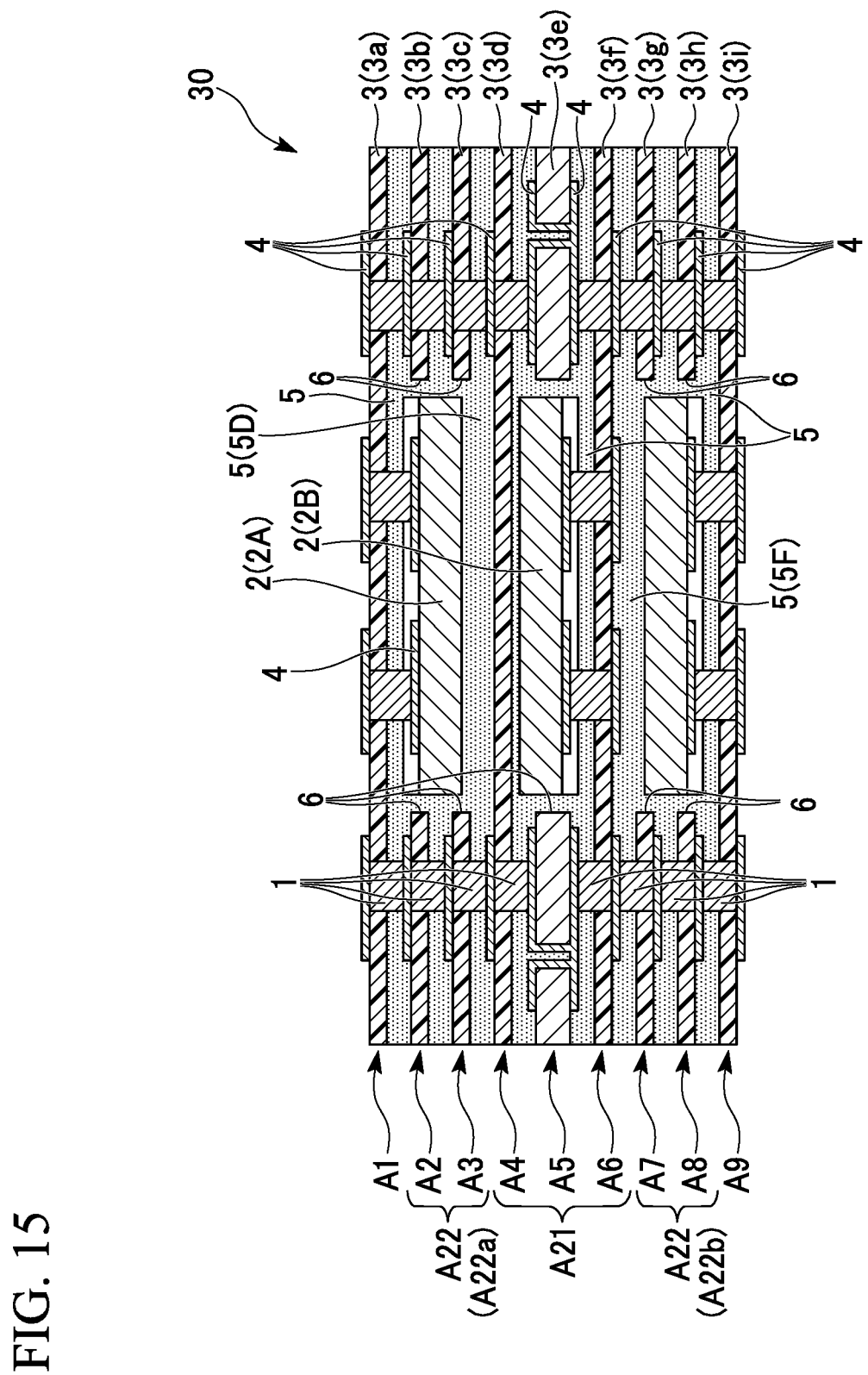
FIG. 15 is a process drawing following the previous figure.

As shown in FIG. 14 and FIG. 15, the first-ninth wiring boards A1-A9 and the electric components 2A-2C are laminated by a collective lamination method, and thereby component-embedded board 30 is obtained.

The second electric component 2A is embedded in the component-embedded board 30 so as to be covered by the adhesion layer 5a of the first wiring board A1 and the electric component adhesion layer 5D of the fourth wiring board A4.

The third electric component 2C is embedded in the component-embedded board 30 so as to be covered by the adhesion layer 5i of the ninth wiring board A1 and the electric component adhesion layer 5F of the sixth wiring board A6.

The component-embedded board 30 includes: a first component substrate A21 (first base) which incorporates the first electric component 2B; the second and third electric components 2A and 2C provided on and under (both sides of) the first component substrate A21; an intermediate substrate A22 (A22a and A22b) (second base) provided on and under (both sides of) the first component substrate A21; and the first and ninth wiring boards A1 and A9 (third base) provided further outside the intermediate substrate A22 (A22*a* and A22*b*), respectively.

The first component substrate A21 includes the wiring boards A4-A6, the intermediate substrate A22 (A22*a*) includes the wiring boards A1-A3, and the intermediate substrate A22 (A22*b*) includes the wiring boards A7-A9.

In the component-embedded board 30 (refer to FIG. 14 and FIG. 15), since the electric component adhesion layer 5D is formed on the fourth wiring board A4, the first face 2A1 of the second electric component 2A is covered by the adhesion layer 5*a* of the first wiring board A1, while the second face 2A2 is covered by the electric component adhesion layer 5D of the fourth wiring board A4. Since the electric component adhesion layer 5D is formed so as not to overlap the adhesion layer 5*c* of the third wiring board A3, the electric component adhesion layer 5D and the adhesion layer 5*c* are present in the same plane after a lamination.

Similarly, since the electric component adhesion layer 5F is formed on the sixth wiring board A6, the first face 2C1 of the third electric component 2C is covered by the electric component adhesion layer 5F of the sixth wiring board A6, while the second face 2C2 is covered by the adhesion layer 5*i* of the ninth wiring board A9. Since the electric component adhesion layer 5F is formed so as not to overlap the adhesion layer 5*g* of the seventh wiring board A7, the electric component adhesion layer 5F and the adhesion layer 5*g* are present in the same plane after a lamination.

Accordingly, the total thickness of the adhesion layer 5 (5*a*, 5D, 5F, and 5*i*) covering the electric components 2A and 2C can be substantially the same as the total thickness of the adhesion layer 5 for laminating the wiring boards A1, A3, A7, and A9. As a result, the thickness of the adhesion layer 5 can be minimized, and thus a reduction of the thickness of the component-embedded board 30 can be achieved.

In addition, the above-described manufacturing method (refer to FIG. 9-FIG. 15) uses the first component substrate A21 in which the electric component adhesion layers 5D and 5F are formed on the wiring boards A4 and A6, and includes a step of adhering and fixing the electric components 2A and 2C to the adhesion layers 5F and 5D. That is, the method includes a step of arranging the electric component adhesion layer 5D on the first face 3*d*1 of the fourth wiring board body 3*d* and a step of adhering and fixing the electric component 2A to the adhesion layer 5D. In addition, the method includes a step of arranging the electric component adhesion layer 5F on the second face 3*f*2 of the fourth wiring board body 3*f* and a step of adhering and fixing the electric component 2C to the adhesion layer 5F. For this reason, even in a case where the size of the opening portion 6 (6*c*, 6*g*) is large, breakage of the electric component adhesion layers 5D and 5F does not occur, and thus the faces 2A2 and 2C1 of the electric components 2A and 2C can be reliably covered by the adhesion layer 5.

The component-embedded boards 20 and 30 shown in FIG. 1, FIG. 2, FIG. 14, and FIG. 15 include: the first component substrate (first base); the electric components and the intermediate substrates (second base) each provided on both sides of the first component substrate; and the wiring board (third base) provided further outside each intermediate substrate. However, the present invention is not limited to this, and only either side of the first component substrate (first base) may be provided with the electric component, the intermediate substrate (second base), and the outside wiring board (third base) as shown below.

Figure 16:
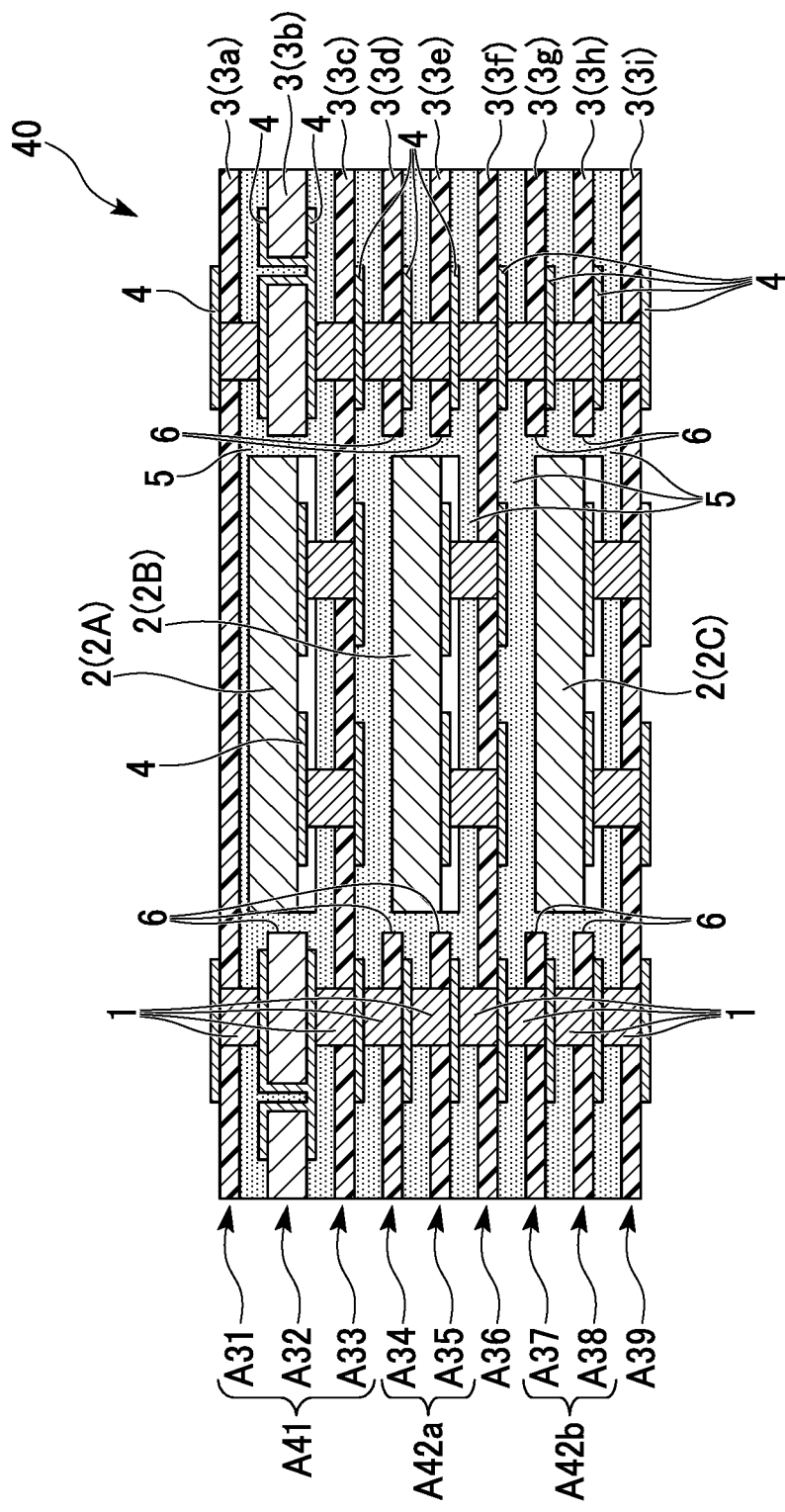
FIG. 16 is a process drawing following the previous figure.

FIG. 16 is a cross-sectional view showing a component-embedded board 40 according to a fourth embodiment of the present invention.

The component-embedded board 40 includes: a first component substrate A41 (first base) incorporating the first electric component 2A; the second electric component 2B provided on the lower side of the first component substrate A41; an intermediate substrate A42*a* (second base) provided on the lower side of the first component substrate A41 and incorporating the second electric component 2B; a sixth wiring board A36 (third base) provided on the lower side of the intermediate substrate A42*a*; an intermediate substrate A42*b* (second base) provided on the lower side of the sixth wiring board A36 and incorporating the third electric component 2C; and a ninth wiring board A39 (third base) provided on the lower side of the intermediate substrate A42*b*.

The first component substrate A41 includes: a second wiring board A32 (inner-layer base) incorporating the first electric component 2A; a first wiring board A31 (first-side base) facing the first face (upper face) of the second wiring board A32; and a third wiring board A33 (second-side base) facing the second face (lower face) of the second wiring board A32.

The second wiring board A32 is a double-sided wiring board in which the conductive layer 4 is provided on both faces of the second wiring board body 3*b* (inner-layer substrate) having the opening portion 6 in a position at which the first electric component 2A is embedded. The first and third wiring boards A31 and A33 are a single-sided wiring board in which the conductive layer 4 (first-side electrode and second-side electrode) is provided only on the outer face of the first and third wiring board bodies 3*a* (first-side substrate) and 3*c* (second-side substrate).

The intermediate substrate A42*a* includes a fourth wiring board A34 and a fifth wiring board A35 facing the second face (lower face side) of the fourth wiring board A4.

The fourth and fifth wiring boards A34 and A35 include the wiring board bodies 3*d* and 3*e* having the opening portion 6 in a position at which the second electric component 2B is embedded, and the conductive layer 4 is formed on the second face (lower face) of the wiring board bodies 3*d* and 3*e*.

The sixth wiring board A36 includes the sixth wiring board body 3*f*, and the conductive layer 4 is formed on the second face (lower face) of the sixth wiring board body 3*f*.

The intermediate substrate A42*b* includes a seventh wiring board A37 and a eighth wiring board A38 facing the second face (lower face) of the seventh wiring board A37.

The seventh and eighth wiring boards A37 and A38 include the wiring board bodies 3*g* and 3*h* having the opening portion 6 in a position at which the third electric component 2C is embedded, and the conductive layer 4 is formed on the second face (lower face) of the wiring board bodies 3*g* and 3*h*.

The ninth wiring board A39 includes the ninth wiring board body 3*i*, and the conductive layer 4 is formed on the second face (lower face) of the ninth wiring board body 3*i*.

The component-embedded board 40 includes the electric component adhesion layer 5 facing the first face (upper face) of the wiring boards A34 and A37 as with the component-embedded board 20 (refer to FIG. 1) (e.g., seventh wiring board A7), or includes the electric component adhesion layer 5 facing the second face (lower face) of the wiring boards A33 and A36 as with the component-embedded board 30 (refer to FIG. 14) (e.g., sixth wiring board A6); and thereby both faces of the electric components 2B and 2C can be covered by the adhesion layer 5.

Accordingly, as with the component-embedded boards 20 and 30, the total thickness of the adhesion layer 5 covering the electric components 2B and 2C can be minimized, and thus a reduction of the thickness of the component-embedded board 40 can be achieved.

According to the above-described embodiments of the present invention, it is possible to provide a component-embedded board and a method of manufacturing the same which enable a reduction of the whole thickness of the component-embedded board including a plurality of substrates which incorporate an electric component.

What is claimed is:

1. A component-embedded board comprising:
    a first base comprising a first substrate which incorporates a first electric component, and a first electrode which is provided on a first face of the first substrate and electrically connected to the first electric component;
    a first adhesion portion provided on the first face of the first substrate;
    a second electronic component fixed on the first face of the first substrate with the first adhesion portion therebetween;
    a second base comprising a second substrate having an opening portion in a position at which the second electronic component is embedded, and a second electrode exposed at a first face of the second substrate;
    a second adhesion portion arranged between the first base and the second base, and fixing a second face of the second substrate on the first face of the first substrate;
    a third base comprising a third substrate and a third electrode which is exposed at a first face of the third substrate; and
    a third adhesion portion arranged between the second base and the third base, and fixing a second face of the third substrate on the first face of the second substrate,
    wherein
    the first electrode, the second electrode, and the third electrode are electrically connected to the second electronic component,
    the second electronic component is surrounded, at least, by the first adhesion portion and the third adhesion portion,
    the first base comprises an inner-layer base which incorporates the first electric component, a first-side base which faces a first face of the inner-layer base, and a second-side base which faces a second face of the inner-layer base,
    the inner-layer base comprises: an inner-layer substrate which has an opening portion in a position at which the first electric component is embedded; and a first wiring layer and a second wiring layer formed on a first face and a second face of the inner-layer substrate, respectively,
    the first-side base comprises: a first-side substrate having a first face and a second face which faces the first face of the inner-layer substrate; a third wiring layer formed on the first face of the first-side substrate; and a first interlayer conductive portion penetrating the first-side substrate in a thickness direction of the first-side substrate, one end of the first interlayer conductive portion contacting the third wiring layer, and another end of the first interlayer conductive portion contacting the first wiring layer, and
    the second-side base comprises: a second-side substrate having a first face, which faces the second face of the inner-layer substrate, and a second face; a fourth wiring layer formed on the second face of the second-side substrate; and a second interlayer conductive portion penetrating the second-side substrate in a thickness direction of the second-side substrate, one end of the second interlayer conductive portion contacting the second wiring layer, and another end of the second interlayer conductive portion contacting the fourth wiring layer.

2. The component-embedded board according to claim 1, wherein the second electronic component is surrounded by the first adhesion portion, the second adhesion portion, and the third adhesion portion.

3. A method of manufacturing a component-embedded board according to claim 1, the method comprising:
    arranging the first adhesion portion on the second face of the second substrate; and
    fixing the second electronic component to the first adhesion portion.

4. A method of manufacturing a component-embedded board according to claim 1, the method comprising:
    arranging the first adhesion portion on the first face of the first substrate; and
    fixing the second electronic component to the first adhesion portion.

* * * * *